US012672406B2

(12) United States Patent
Chen et al.

(10) Patent No.: US 12,672,406 B2
(45) Date of Patent: Jun. 30, 2026

(54) DISPLAY BASEPLATE AND DISPLAY APPARATUS

(71) Applicants: BOE MLED Technology Co., Ltd., Beijing (CN); BOE Technology Group Co., Ltd., Beijing (CN)

(72) Inventors: Chenchang Chen, Beijing (CN); Wenjia Sun, Beijing (CN); Ruoyu Ma, Beijing (CN); Liangliang Jin, Beijing (CN); Zezhou Yang, Beijing (CN); Le Zhao, Beijing (CN); Qingkai Zhang, Beijing (CN); Jiao Li, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 407 days.

(21) Appl. No.: 18/574,295

(22) PCT Filed: Apr. 22, 2022

(86) PCT No.: PCT/CN2022/088449
§ 371 (c)(1),
(2) Date: Dec. 26, 2023

(87) PCT Pub. No.: WO2023/201699
PCT Pub. Date: Oct. 26, 2023

(65) Prior Publication Data
US 2024/0304771 A1　　Sep. 12, 2024

(51) Int. Cl.
H10H 20/856 (2025.01)
G09F 9/33 (2006.01)
(Continued)

(52) U.S. Cl.
CPC ............. H10H 20/856 (2025.01); G09F 9/33 (2013.01); H10H 29/856 (2025.01); H10W 90/00 (2026.01)

(58) Field of Classification Search
CPC ................ H10H 29/856; H10H 20/856; F21Y 2105/16; G09F 9/33
See application file for complete search history.

(56) References Cited

U.S. PATENT DOCUMENTS 6,065,854 A 　 5/2000 West et al.
2012/0319150 A1 * 12/2012 Shimomura ....... H10H 20/8506
257/E33.072
(Continued)

FOREIGN PATENT DOCUMENTS

CN 　 103928594 A 　 7/2014
CN 　 109148531 A 　 1/2019
(Continued)

OTHER PUBLICATIONS

PCT/CN2022/088449 international search report.
PCT/CN2022/088449 Written Opinion.

*Primary Examiner* — Alexander K Garlen
(74) *Attorney, Agent, or Firm* — IPro, PLLC

(57) ABSTRACT

The present disclosure provides a display baseplate and a display apparatus. The display baseplate includes a substrate, light emitter groups on the substrate, a light-adjusting structure on the substrate, and a diffusion structure on the substrate. The light emitter groups include light emitters. Chambers are disposed in the light-adjusting structure, and one light emitter group is located in one chamber; the orthographic projections of the chambers in which the light emitter groups are located on the substrate have basically same area; the light-adjusting structure is configured to converge light emitted by the light emitters to increase an amount of light of positive view angle of the display baseplate. The diffusion structure is at least partially located at a side of the light emitters away from the substrate, and configured to diffuse the light emitted by the light emitters.

16 Claims, 10 Drawing Sheets

(51) Int. Cl.
> *H10H 29/856*       (2025.01)
> *H10W 90/00*       (2026.01)

(56)            References Cited

U.S. PATENT DOCUMENTS

| | | | |
|---|---|---|---|
| 2013/0256711 A1* | 10/2013 | Joo .................... | H10H 20/8506 |
| | | | 438/28 |
| 2016/0379964 A1 | 12/2016 | Wang et al. | |
| 2018/0010754 A1* | 1/2018 | Albou ................. | H10H 20/854 |
| 2020/0219950 A1 | 7/2020 | Huang et al. | |
| 2020/0300444 A1* | 9/2020 | Lee ......................... | F21V 13/08 |
| 2024/0069383 A1* | 2/2024 | Yang ................. | G02F 1/133611 |

FOREIGN PATENT DOCUMENTS

| | | | | |
|---|---|---|---|---|
| CN | 209785460 U | 12/2019 | | |
| CN | 110970546 A | 4/2020 | | |
| CN | 111739430 A | * 10/2020 | .............. | G09F 9/33 |
| CN | 111370560 B | 9/2021 | | |
| CN | 113540054 A | 10/2021 | | |
| CN | 114171548 A | 3/2022 | | |
| CN | 114242701 A | 3/2022 | | |
| WO | WO-2019112397 A1 | * 6/2019 | ............ | H10W 90/00 |

* cited by examiner

DISPLAY BASEPLATE AND DISPLAY APPARATUS

CROSS-REFERENCE TO RELATED APPLICATIONS

This application is a national stage of international PCT Application No. PCT/CN2022/088449 filed on Apr. 22, 2022, the entire contents of which are incorporated herein by reference.

TECHNICAL FIELD

The present disclosure relates to the field of display technologies and in particular to a display baseplate and a display apparatus.

BACKGROUND

Mini-LED and Micro LED are novel LED display technologies derived from mini-spacing LEDs and are also called sub-millimeter light-emitting diodes. Due to their good display effect, lightness, and thinness as well as advantages of high contrast, long life span and the like, there is a noticeable tendency of using them in the display field.

SUMMARY

The present disclosure provides a display baseplate and a display apparatus.

According to a first aspect of embodiments of the present disclosure, there is provided a display baseplate, including:

a substrate;

light emitter groups located on the substrate, where the light emitter groups each include a plurality of light emitters;

a light-adjusting structure located on the substrate, where a plurality of chambers are disposed in the light-adjusting structure, and one light emitter group is located in one chamber; orthographic projections of the chambers in which the light emitter groups are located on the substrate have basically same area; a distance between adjacent light emitters in a same light emitter group is less than a distance between adjacent light emitter groups, and at least one chamber is present between adjacent light emitter groups; the light-adjusting structure is configured to converge light emitted by the light emitters to increase an amount of light of positive view angle of the display baseplate; and a diffusion structure located on the substrate, where the diffusion structure is at least partially located at a side of the light emitters away from the substrate, and configured to diffuse the light emitted by the light emitters.

In some embodiments, there is a gap between a side surface of the light emitters and an inner surface of the chambers.

In some embodiments, a gray value of the light-adjusting structure is greater than 0 and less than 1.

In some embodiments, the light-adjusting structure includes reflection blocking walls inside the chambers, the reflection blocking walls partition the chambers into a plurality of sub-chambers, and one light emitter is located in one sub-chamber; orthographic projections of the sub-chambers on the substrate have basically same area.

In some embodiments, the display baseplate further includes transparent encapsulation structures at least partially filled in the chambers.

In some embodiments, the diffusion structure includes scattered particles scattered in the transparent encapsulation structures.

In some embodiments, the display baseplate includes a first end and a second end that are opposite to each other;

one light emitter is wrapped by one transparent encapsulation structure, the scattered particles are uniformly distributed in the transparent encapsulation structure, a surface, away from the substrate, of the transparent encapsulation structures corresponding to at least part of the light emitters is an inclined surface, and in a direction pointing to the second end from the first end, the inclined surface is inclined toward the substrate; or, the scattered particles in a part, proximate to the first end, of the transparent encapsulation structures corresponding to at least part of the light emitters have a larger density than the scattered particles in a part thereof proximate to the second end.

In some embodiments, the light emitter groups each include a light emitter with a luminous color as green, a light emitter with a luminous color as red and a light emitter with a luminous color as blue;

the surface, away from the substrate, of the transparent encapsulation structures corresponding to the light emitter with the luminous color as green and the light emitter with the luminous color as blue is the inclined surface;

or, the scattered particles in the part, proximate to the first end, of the transparent encapsulation structures corresponding to the light emitter with the luminous color as green and the light emitter with the luminous color as blue have a larger density than the scattered particles in the part thereof proximate to the second end.

In some embodiments, in a case where the surface, away from the substrate, of the transparent encapsulation structures corresponding to the light emitter with the luminous color as green and the light emitter with the luminous color as blue is the inclined surface, an angle of inclination of an inclined surface corresponding to the light emitter with the luminous color as green is greater than an angle of inclination of an inclined surface corresponding to the light emitter with the luminous color as blue;

or, in a case where the scattered particles in the part, proximate to the first end, of the transparent encapsulation structures corresponding to the light emitter with the luminous color as green and the light emitter with the luminous color as blue have a larger density than the scattered particles in the part thereof proximate to the second end, the density of the scattered particles in the part, proximate to the first end, of the transparent encapsulation structure corresponding to the light emitter with the luminous color as green is greater than the density of the scattered particles in the part, proximate to the first end, of the transparent encapsulation structure corresponding to the light emitter with the luminous color as blue.

In some embodiments, the diffusion structure includes micro-structure arrays located at a side of the light-adjusting structure away from the substrate, and the micro-structure arrays include a plurality of micro-structures arranged in a spacing.

In some embodiments, the display baseplate includes a first end and a second end that are opposite to each other, where in a direction pointing to the second end from the first end, the micro-structures in a part, proximate to the first end, of the micro-structure arrays corresponding to at least part of the light emitters have a larger density than the micro-structures in a part thereof proximate to the second end.

In some embodiments, the light emitter groups each include a light emitter with a luminous color as green, a light emitter with a luminous color as red and a light emitter with a luminous color as blue; the micro-structures in the part, proximate to first end, of the micro-structure arrays corre-sponding to the light emitter with the luminous color as green and the light emitter with the luminous color as blue have a greater density than the micro-structures in the part thereof proximate to the second end.

In some embodiments, the density of the micro-structures in the part, proximate to the first end, of the micro-structure array corresponding to the light emitter with the luminous color as green is greater than the density of the micro-structures in the part, proximate to the first end, of the micro-structure array corresponding to the light emitter with the luminous color as blue.

In some embodiments, the display baseplate further includes a light-adjusting layer located at a side of the light-adjusting structure away from the substrate, and a plurality of through holes are disposed in the light-adjusting layer;

an orthographic projection of each light emitter on the substrate is located within an orthographic projection of one through hole on the substrate; or, the orthographic projections of the light emitters in each light emitter group on the substrate are all located within the ortho-graphic projection of one through hole on the substrate.

In some embodiments, the display baseplate further includes a light transmission layer located at a side of the light-adjusting structure away from the substrate, and the orthographic projections of the light emitters on the sub-strate are located within the orthographic projections of the light transmission layer on the substrate; the display base-plate further includes transparent encapsulation structures at least partially filled in the chambers;

a light transmittance of the light transmission layer is greater than a light transmittance of the light-adjusting layer and less than a light transmittance of the trans-parent encapsulation structures.

According to a second aspect of embodiments of the present disclosure, there is provided a display apparatus, including the above display baseplate.

In the display baseplate and the display apparatus pro-vided by the embodiments of the present disclosure, the light-adjusting structure converges the light emitted by the light emitters to increase an amount of light of positive view angle of the display baseplate and reduce an amount of light of side view angle. Thus, the amount of light is gradually decreased from the positive view angle to the side view angle in the display baseplate, better satisfying watching habit of the human eyes, and helping improve the use experiences of the users. The diffusion structure can ensure an amount of light of large-view-angle and smooth change of light brightness from the positive view angle to the side view angle, better satisfying the watching habit of the human eyes. Further, a chromatic aberration of the lights of the positive view angle and the large-view-angle can be reduced so as to improve the display effect of the display baseplate. Since the orthographic projections of the chambers in which the light emitter groups are located on the substrate have a basically same area, the light-adjusting structure performs basically consistent light adjustment on the light emitter groups, such that the display baseplate has more uniform brightness, having better display effect. Since the distance between adjacent light emitters in a same light emitter group is less than the distance between adjacent light emitter groups, and at least one chamber is present between adjacent light emitter groups, when the light-adjusting structure is manufactured, distances of the light emitters from an inner surface of the chamber where the light emitters are located are more consistent while the difficulty of the manufacture process of the light-adjusting structure is reduced. Hence, the light-adjusting structure performs more consistent light adjustment on the light emitter groups, further improving the display effect of the display baseplate.

DETAILED DESCRIPTION OF THE EMBODIMENTS

Figure 1:
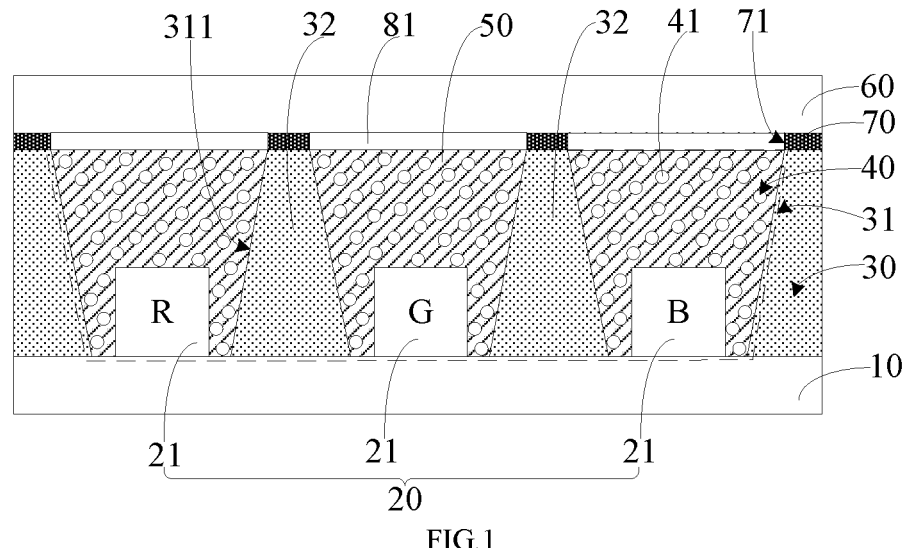
FIG. 1 is a partial sectional view of a display baseplate according to some exemplary embodiments of the present disclosure.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality forms, unless clearly indicated otherwise in the context. It will also be understood that the term "and/or" as used herein refers to and includes any or all possible combinations of one or more of the associated listed items.

It is to be understood that, although the terms "first," "second," "third," and the like may be used in the present disclosure to describe various information, such information should not be limited to these terms. These terms are only used to distinguish one category of information from another. For example, without departing from the scope of the present disclosure, first information may be referred as second information; and similarly, the second information may also be referred as the first information. Depending on the context, the term "if" as used herein may be interpreted as "when" or "upon" or "in response to determining".

Embodiments of the present disclosure provide a display baseplate and a display apparatus. The display baseplate and the display apparatus in the embodiments of the present disclosure will be detailed below in combination with drawings. In case of no conflicts, the features in the following embodiments can be mutually supplemented or combined.

Some embodiments of the present disclosure provide a display baseplate. As shown in FIGS. 1 to 6, the display baseplate includes a substrate 10, a light emitter group 20 on the substrate 10, a light-adjusting structure 30 on the substrate 10, and a diffusion structure 40 on the substrate 10.

Figure 6:
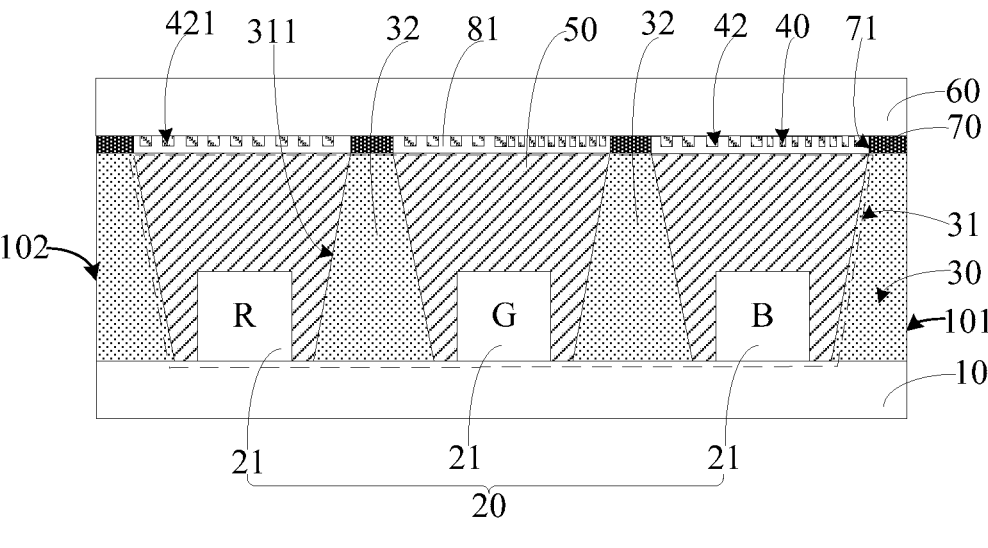
FIG. 6 is a partial sectional view of yet another display baseplate according to some exemplary embodiments of the present disclosure.
Figure 7:
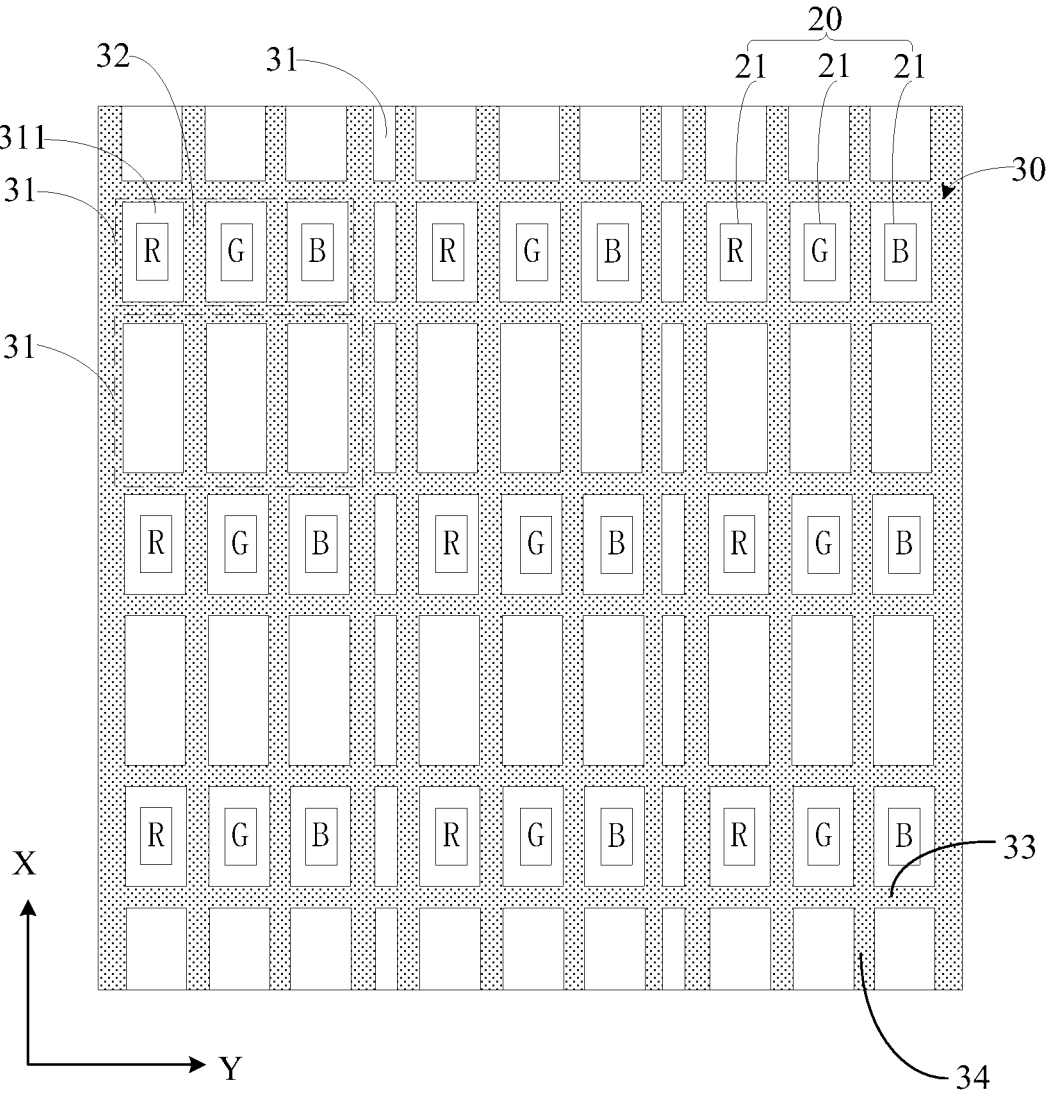
FIG. 7 is a partial structural view of a display baseplate according to some exemplary embodiments of the present disclosure.
Figure 8:
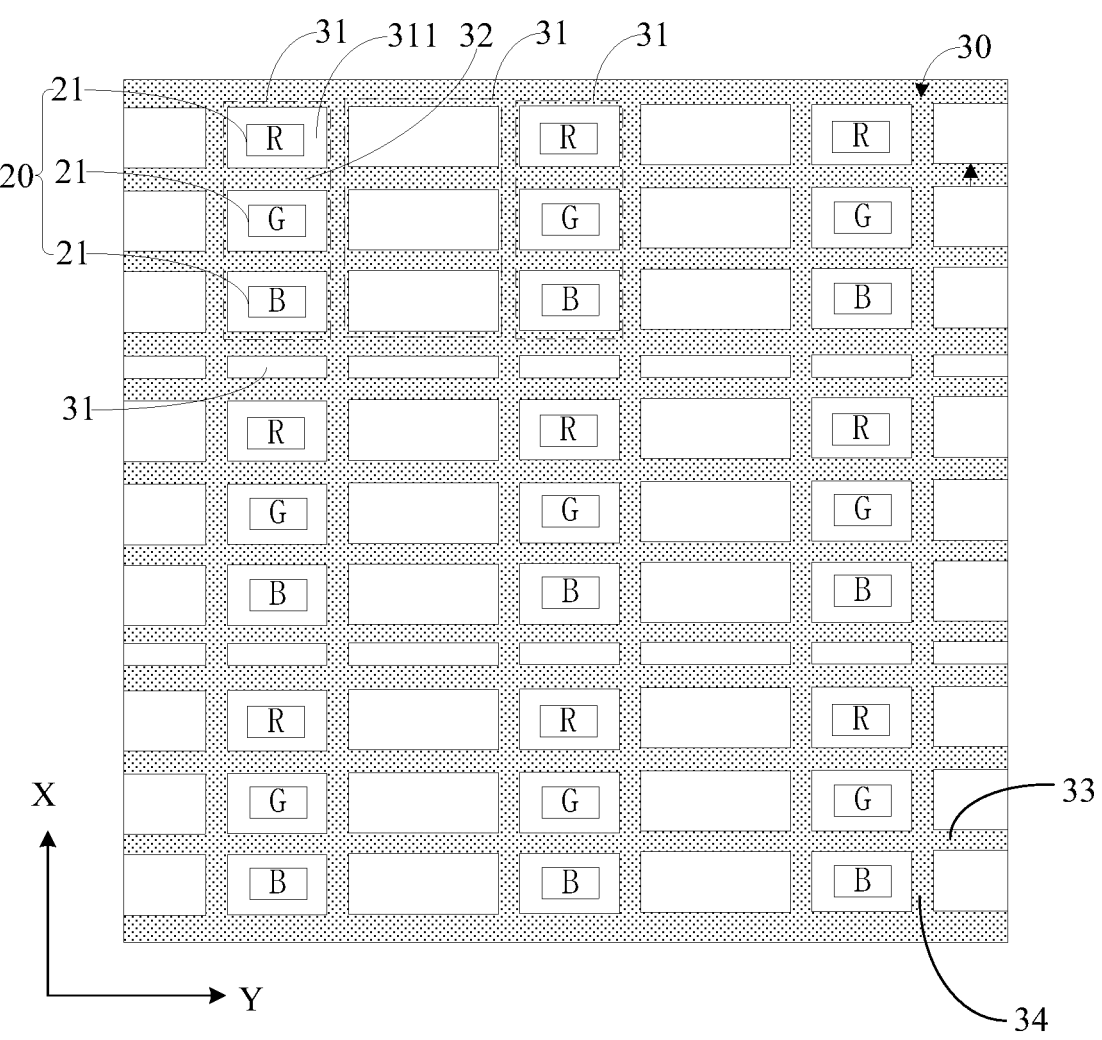
FIG. 8 is a partial structural view of another display baseplate according to some exemplary embodiments of the present disclosure.

The light emitter group 20 includes a plurality of light emitters 21. A plurality of chambers 31 are disposed in the light-adjusting structure 30, and one light emitter group 20 is located in one chamber 31. As shown in FIGS. 6 to 8, orthographic projections of the chambers 31 in which the light emitter groups 20 are located on the substrate 10 have a basically same area. A distance between adjacent light emitters 21 in a same light emitter group 20 is less than a distance between adjacent light emitter groups 20, and at least one chamber 31 is present between adjacent light emitter groups 20. The light-adjusting structure 30 is configured to converge light emitted by the light emitters 21 to increase an amount of light with positive view angle of the display baseplate. The orthographic projections of the chambers 31 in which the light emitter groups 20 are located on the substrate 10 having a basically same area means that the orthographic projections of the chambers 31 in which the light emitter groups 20 are located on the substrate 10 have a same area or have a very small area difference which is within a preset range. The diffusion structure 40 is at least partially located at a side of the light emitters 21 away from the substrate 10 and configured to diffuse light emitted by the light emitters 21.

In the display baseplate provided by the embodiments of the present disclosure, the light-adjusting structure 30 converges the light emitted by the light emitters 21 to increase an amount of light with positive view angle of the display baseplate and reduce an amount of light with side view angle. Thus, the amount of light is gradually decreased from the positive view angle to the side view angle in the display baseplate, better satisfying watching habit for the human eyes, and helping improve the use experiences of the users. The diffusion structure can ensure an amount of light with large-view-angle and smooth change of light brightness from the positive view angle to the side view angle, better satisfying the watching habit of the human eyes. Further, a chromatic aberration of the lights of the positive view angle and the large-view-angle can be reduced so as to improve the display effect of the display baseplate. Since the orthographic projections of the chambers 31 in which the light emitter groups 20 are located on the substrate 10 have a basically same area, the light-adjusting structure 30 performs basically consistent light adjustment on the light emitter groups 20, such that the display baseplate has more uniform brightness, having better display effect. Since the distance between adjacent light emitters 21 in a same light emitter group 20 is less than the distance between adjacent light emitter groups 20, and at least one chamber 31 is present between adjacent light emitter groups 20, when the light-adjusting structure 30 is manufactured, distances of the light emitters from an inner surface of the chamber 31 where the light emitters are located are more consistent while the difficulty of the manufacture process of the light-adjusting structure 30 is reduced. Hence, the light-adjusting structure 30 performs more consistent light adjustment on the light emitter groups 20, further improving the display effect of the display baseplate.

Figure 9:
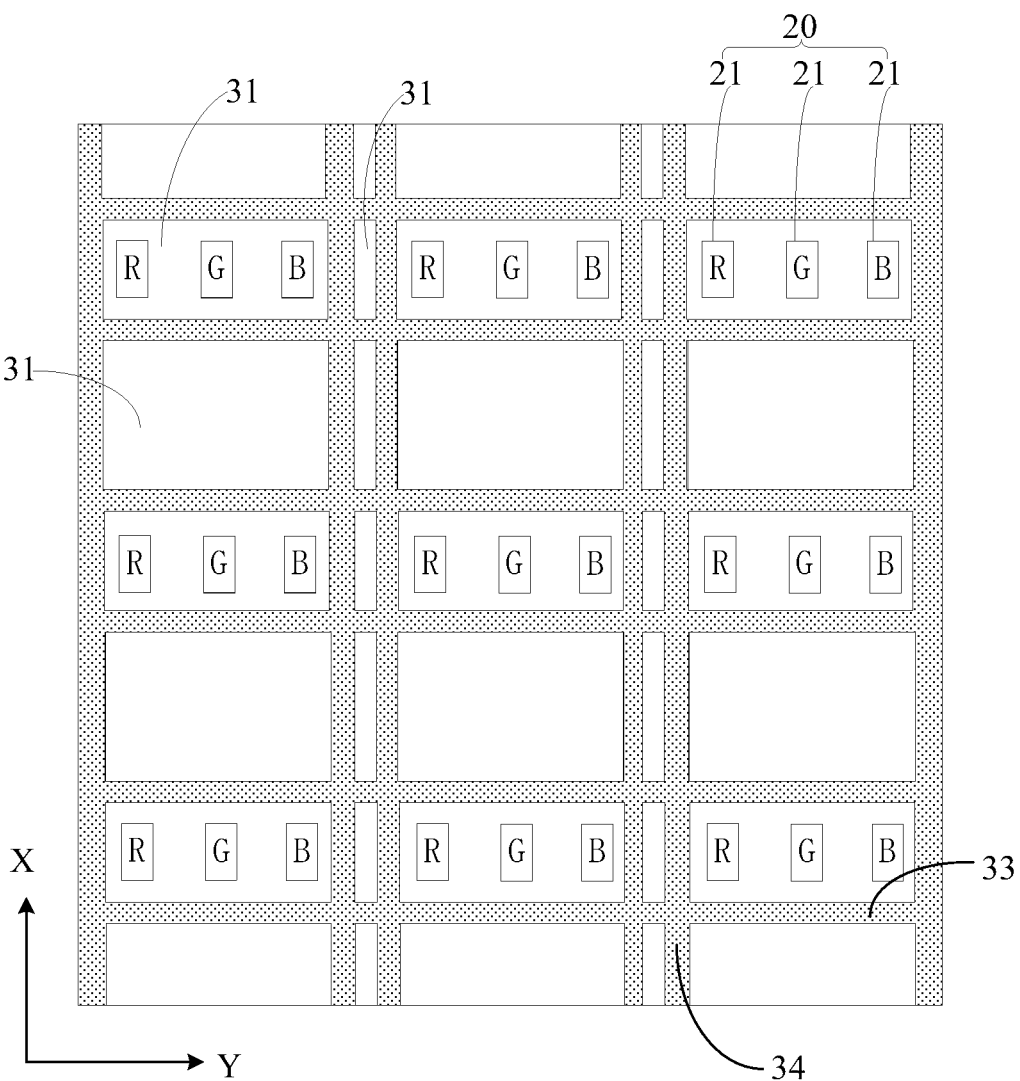
FIG. 9 is a partial structural view of yet another display baseplate according to some exemplary embodiments of the present disclosure.

In some embodiments, as shown in FIGS. 7 to 9, the light-adjusting structure 30 includes a plurality of first blocking walls 33 extending in a first direction Y and a plurality of second blocking walls 34 extending in a second direction. When the light-adjusting structure 30 is manufactured, the plurality of first blocking walls 33 may be first formed, and then the plurality of second blocking walls 34 are formed. Each first blocking wall 33 intersects with the plurality of second blocking walls 34, and each second blocking wall 34 intersects with the plurality of first blocking walls 33. The plurality of chambers 31 are enclosed by the first blocking walls 33 and the second blocking walls 34. In some embodiments, the first direction Y may be perpendicular to the second direction X, for example, the first direction Y may be a row direction and the second direction X may be a column direction. The first blocking walls 33 and the second blocking walls 34 may be formed by processes such as 3D printing, imprinting, glue dispensing, which are not limited herein.

During a process of manufacturing the light-adjusting structure 30, widths of the first blocking walls 33 and the second blocking walls 34 are given, and the distance between adjacent light emitter groups 20 is also given. Under the precondition of not changing the manufacture process of the light-adjusting structure 30, in order to ensure the distance between adjacent light emitter groups 20, at least one chamber 31 may be formed between adjacent light emitter groups 20. In this way, the difficulty of the manufacture of the light-adjusting structure 30 will not be increased.

In some embodiments, the orthographic projections of the chambers 31 in which the light emitter groups 20 are located on the substrate 10 have a basically same shape. In this case, the environments of the chambers 31 in which the light emitters are located are more consistent, and the light-adjusting structure 30 performs more consistent light adjustment on the light emitted by the light emitter groups 20. Thus, the brightness distribution of the display baseplate will be more uniform.

In some embodiments, the substrate 10 may be a flexible substrate, or a rigid substrate. The material of the flexible substrate may include one or more of polyimide, polyethylene terephthalate, polycarbonate, and organic resin. The material of the organic resin may include epoxy resin, triazine, silicon resin or polyimide or the like. The rigid substrate includes any one of glass substrate, quartz substrate, sapphire substrate and ceramic substrate; or semiconductor substrate, for example, one of monocrystalline semiconductor substrate or polycrystalline semiconductor substrate with silicon or silicon carbide or the like as material, compound semiconductor substrate with silicon germanium or the like, and silicon on insulator (SOI) substrate. In some illustrative embodiments, the substrate may be a printed circuit board (PCB) of FR4 type, or a deformable flexible PCB. In some illustrative embodiments, the substrate may include any one of a ceramic material such as silicon nitride, AlN or $Al_2O_3$, or metal or metal compound, or a metal core PCB (MCPCB) or metal copper clad laminate (MCCL).

In some embodiments, the light emitter 21 may be a Mini LED or a Micro LED.

In some embodiments, the light emitter group 20 includes a plurality of light emitters 21 with different luminous colors. For example, the light emitter group includes a light emitter R with the luminous color as red, a light emitter G with the luminous color as green and a light emitter B with the luminous color as blue. The light emitter group 20 may be used as one pixel. In some embodiments, in the light emitters included in the light emitter group, some or all of the light emitters emit the light of same color.

In some embodiments, there is a gap between a side surface of the light emitters 21 and an inner surface of the chambers 31. In this way, the light emitted by the side surface of the light emitters 21 is reflected by the inner surface of the chambers 31 and then emitted out of the top of the chambers 31. Therefore, the light utilization rate of the light emitters 21 and the display brightness of the display baseplate can be improved, helping reduce the power consumption of the display baseplate.

In some embodiments, in a direction away from the substrate 10, the inner surface of the chamber 31 extends obliquely away from the light emitters 21. This disposal helps to increase an amount of light reflected by the inner surface of the chamber 31 for the light emitted by the light emitter 21. Hence, the utilization rate for the light emitted by the light emitter 21 can be improved and the manufacture process of the light-adjusting structure 30 is simplified. In some embodiments, as shown in FIGS. 1 to 6, in a thickness direction of the substrate 10, the section of the chamber 31 is an inverted trapezoid.

In some embodiments, a height of the chamber 31 in a direction perpendicular to the substrate 10 is greater than a height of the light emitter 21 in a direction perpendicular to the substrate 10. In this way, the light-adjusting structure 30 can reflect at least a part of the large-angle light emitted by the light emitters 21, so as to improve the optical effect of the display panel.

In some embodiments, as shown in FIGS. 7 and 9, a plurality of light emitters 21 in a same light emitter group 20 are arranged in the first direction Y, there is at least one chamber 31 between two adjacent light emitter groups 20 in the first direction Y, and there is at least one chamber 31 between two adjacent light emitter groups 20 in the second direction X. In the embodiments shown in FIGS. 7 and 9, there is one chamber 31 between two adjacent light emitter groups 20 in the first direction Y, and there is one chamber 31 between two adjacent light emitter groups 20 in the second direction X. In other embodiments, there may be two or more chambers 31 between two adjacent light emitter groups 20 in the first direction Y, and there may be two or more chambers 31 between two adjacent light emitter groups 20 in the second direction X.

In some embodiments, as shown in FIG. 8, a plurality of light emitters 21 in a same light emitter group 20 are arranged in the second direction X, there is at least one chamber 31 between two adjacent light emitter groups 20 in the second direction X, and there is at least one chamber 31 between two adjacent light emitter groups 20 in the first direction Y. In the embodiment shown in FIG. 8, there is one chamber 31 between two adjacent light emitter groups 20 in the first direction Y, and there is one chamber 31 between two adjacent light emitter groups 20 in the second direction X. In other embodiments, there may be two or more chambers 31 between two adjacent light emitter groups 20 in the first direction Y, and there may be two or more chambers 31 between two adjacent light emitter groups 20 in the second direction X.

In some embodiments, a gray value of the light-adjusting structure 30 is greater than 0 and less than 1. In this case, the light-adjusting structure 30 has stronger reflection effect on the light, and the light emitted by the light emitters 21 can be reflected by the inner surface of the chambers 31 and then emitted out of the chambers 31 in a larger amount; further, when the display baseplate is in a non-display state, the light-adjusting structure 30 has good blackness and thus can improve the blackness of the display baseplate in a non-display state, helping improve use experiences of users.

In some embodiments, the light-adjusting structure 30 may be shown as gray.

In some embodiments, the material of the light-adjusting structure 30 may be white oil, which may include resin (e.g., epoxy resin, polytetrafluoro ethylene resin), titanium dioxide (chemical formula: $TiO_2$) and organic solvent (e.g., dipropylene glycol methyl ether) etc. The material of the light-adjusting structure 30 may also include silicon white glue. Alternatively, the material of the light-adjusting structure 30 may also be a material having a high reflective index.

In some embodiments, the light-adjusting structure may have a low expansion coefficient (for example, lower than that of a transparent encapsulation structure inside the chambers as mentioned subsequently) to ensure it is free from bad influence caused by change of a temperature related to operation of the light emitters.

Figure 3:
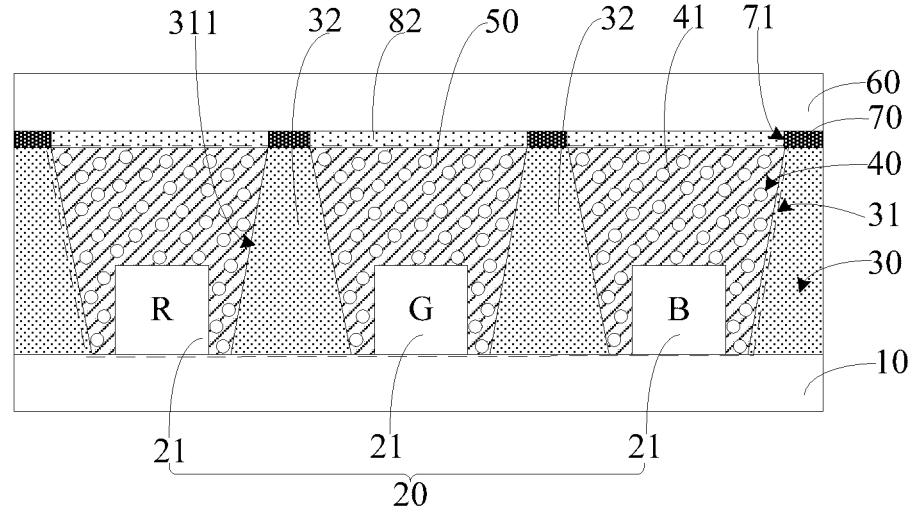
FIG. 3 is a partial sectional view of yet another display baseplate according to some exemplary embodiments of the present disclosure.

In some embodiments, as shown in FIGS. 1, 3 and 8, the light-adjusting structure 30 includes reflection blocking walls 32 inside the chamber 31, and the reflection blocking walls 32 partition the chamber 31 into a plurality of sub-chambers 311 and one light emitter 21 is located in one sub-chamber 311. Orthographic projections of the sub-chambers 311 on the substrate 10 are basically same in area and shape. The orthographic projections of the sub-chambers 311 on the substrate 10 have a basically same area, which means the orthographic projections of the sub-chambers 311 on the substrate 10 have a same area or a very small area difference which is within a preset range. By disposing the reflection blocking walls 32 between adjacent light emitters 21 in a same light emitter group 20, mutual interference of the lights of adjacent light emitters 21 in a same light emitter group 20 can be improved, helping to improve the display effect of the display baseplate. Since the orthographic projections of the sub-chambers 311 on the substrate 10 have basically same area and shape, the chamber environments in which the light emitters 21 are located are same, and thus the light-adjusting structure 30 can perform basically consistent light adjustment on the light emitters 21, helping improve the brightness distribution uniformity of the display baseplate, and the display effect. In the embodiment shown in FIG. 7, the reflection blocking wall 32 is a part of the second blocking wall 34; in the embodiment shown in FIG. 9, the reflection blocking wall 32 is a part of the first blocking wall 33. In the embodiments shown in FIGS. 7 to 9, the reflection blocking walls 32 are also disposed in the chambers 31 between adjacent light emitter groups 20.

Figure 2:
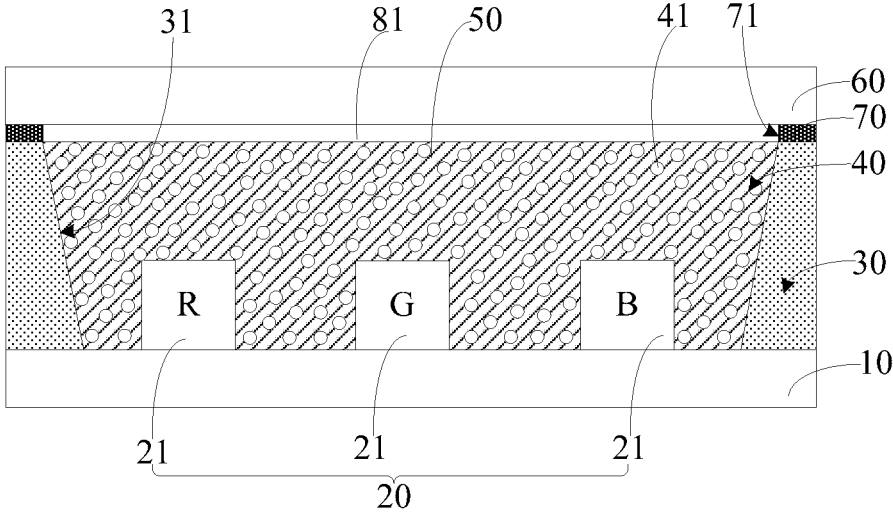
FIG. 2 is a partial sectional view of another display baseplate according to some exemplary embodiments of the present disclosure.

In some embodiments, as shown in FIGS. 2 and 9, no reflection blocking walls are disposed in the chambers 31, that is, reflection blocking walls 32 for separating adjacent light emitters in a same light emitter group 20 are not disposed. When the light emitters 21 have a small size and a small distance is present between adjacent light emitters 21, the reflection blocking wall may not be disposed between adjacent light emitters 21 in a same chamber 31.

In some embodiments, a pattern formed by an inner contour of the orthographic projection of each chamber 31 on the substrate 10 may be a polygon; for example, the polygon may be a rectangle as shown in FIGS. 7 to 9. Optionally, the pattern formed by the inner contour of the orthographic projection of each chamber 31 on the substrate 10 may also be an ellipse or circle. Optionally, pattern formed by the inner contour of the orthographic projection of each chamber 31 on the substrate 10 may also be a pattern formed by combination of polygon and arc shape, for example, a pattern formed by combination of a rectangle and two semicircles.

In some embodiments, as shown in FIGS. 7 to 9, the light-adjusting structure 30 may be a net-shaped structure. It can be understood that the structures of the light-adjusting structure 30 surrounding the light emitter groups are connected to form one-piece structure. In a case where the light-adjusting structure 30 includes the reflection blocking walls 32, the structures of the light-adjusting structure 30 surrounding the light emitter groups are connected with the reflection blocking walls 32 to form one-piece structure. However, in the light emitter groups 30, the structure surrounding each light emitter group 20 may also be an independent structure, that is, the structures surrounding two adjacent light emitter groups 20 are not connected; in a case where the light-adjusting structure 30 includes the reflection blocking walls 32, the reflection blocking walls 32 and the structure surrounding the light emitter group 20 are also formed into an independent structure.

In some embodiments, as shown in FIGS. 1 to 6, the display baseplate further includes a transparent encapsulation structure 50 which is at least partially filled in the chambers 31. The transparent encapsulation structure 50 wraps the light emitter 21. The display baseplate includes a plurality of transparent encapsulation structures 50, and each chamber 31 of the light-adjusting structure 30 is filled with the transparent encapsulation structure 50. Each light emitter corresponds to one transparent encapsulation structure 50. In a case where no reflection blocking walls 32 are disposed in the chamber 31, the transparent encapsulation structure 50 corresponding to the light emitters in a same chamber 31 may be integral structure. When the chamber 31 includes a plurality of sub-chambers 311, each sub-chamber 311 is filled with the transparent encapsulation structure 50. The part of the transparent encapsulation structures 50 located inside the chambers 31 may reduce a reflective index of environmental light incident on the display baseplate, helping to improve the display effect of the display baseplate. In some embodiments, the material of the transparent encapsulation structure 50 may be transparent resin.

In some embodiments, as shown in FIGS. 1 to 4, the diffusion structure 40 may include scattered particles 41 dispersed in the transparent encapsulation structures 50. The scattered particles 41 can increase the scatter degree of the light emitted by the light emitters 21 and enlarge the view angle of the display baseplate. Further, the chromatic aberration of the lights of the positive view angle and the large-view-angle can be reduced and the use experience of the users can be improved. In some embodiments, the scattered particles 41 may be TiO2 nanoparticles and SiO2 nanoparticles and the like.

Figure 4:
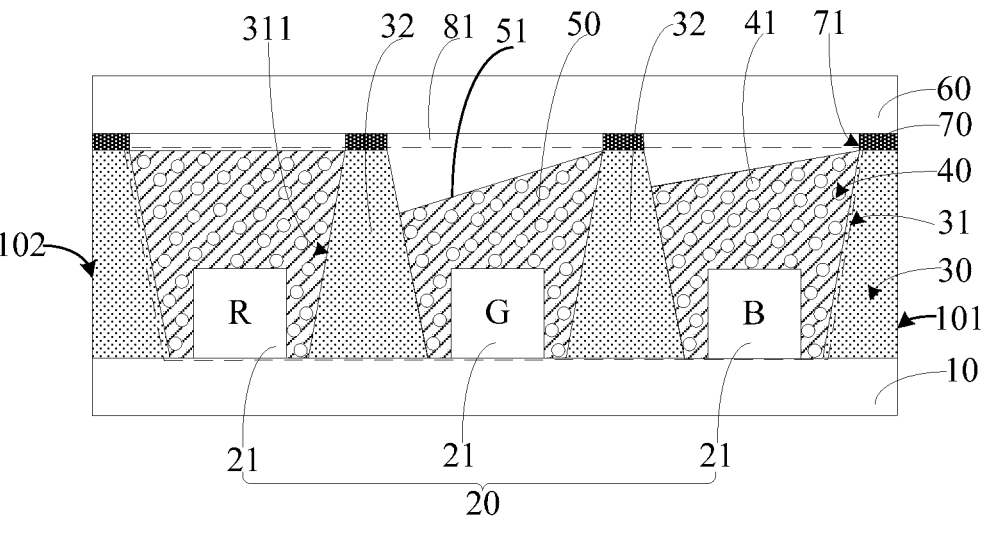
FIG. 4 is a partial sectional view of yet another display baseplate according to some exemplary embodiments of the present disclosure.

In some embodiments, as shown in FIG. 4, the display baseplate includes a first end 101 and a second end 102 that are opposite to each other. The scattered particles 41 are uniformly distributed in the transparent encapsulation structures 50. A surface, away from the substrate 10, of the transparent encapsulation structures 50 corresponding to at least part of the light emitters 21 is an inclined surface 51. In a direction pointing to the second end 102 from the first end 101, the inclined surface 51 is inclined toward the substrate 10. In this way, there are more scattered particles 41 in the part, proximate to the first end 101, of the transparent encapsulation structures 50 corresponding to at least part of the light emitters 21, and thus, the scattered particles have stronger scattering effect on the light proximate to the first end in the light emitted by the light emitters 21, so as to reduce an amount of the large-view-angle light of the first end of the display baseplate, and further reduce a large-view-angle brightness distribution difference and a chromatic aberration of the first end and the second end of the display baseplate, helping improve the use experiences of the users.

In some embodiments, the light emitter group 20 includes a light emitter G with the luminous color as green, a light emitter R with the luminous color as red, and a light emitter B with the luminous color as blue.

Figure 10:
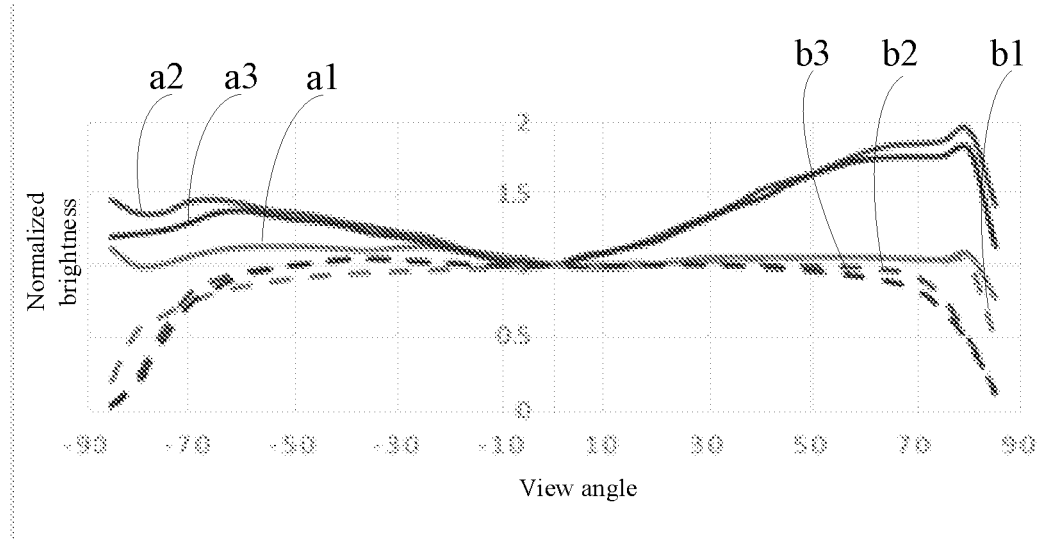
FIG. 10 is a curve diagram illustrating light brightness of a display baseplate and a control display baseplate along with view angle according to some embodiments of the present disclosure.

FIG. 10 is a curve diagram of light brightness distribution in a row direction of the display baseplate, where the curve a1, the curve a2 and the curve a3 respectively represent curves of changes of the brightness of the red light, the green light and the blue light of the display baseplate (the display baseplate is not provided with the light-adjusting structure and the diffusion structure) in a comparative embodiment along with view angle, and the curve b1, the curve b2 and the curve b3 respectively represent curves of changes of the brightness of the red light, the green light and the blue light of the display baseplate in the embodiment shown in FIG. 4 of the present disclosure along with view angle, where the position with the view angle less than 0 is a position closer to the second end of the display baseplate, and the position with the view angle greater than 0 is a position closer to the first end of the display baseplate. From FIG. 10, it can be seen that, in the row direction, the brightness difference and the chromatic aberration of the light of the display baseplate at both sides of the display baseplate in the comparative embodiment are larger. In the display baseplate provided by the embodiment shown in FIG. 4 of the present disclosure, the first end and the second end are two opposite ends of the display baseplate in the row direction. From FIG. 10, it can be seen that, the surface, away from the substrate 10, of the transparent encapsulation structures 50 corresponding to at least part of the light emitters 21 is an inclined surface 51; and in a direction pointing to the second end 102 from the first end 101, the inclined surface 51 is inclined toward the substrate 10. In this case, there are more scattered particles 41 in the part, proximate to the first end 101, of the transparent encapsulation structures 50 corresponding to at least part of the light emitters 21, and thus, the scattered particles have stronger scattering effect on the light proximate to the first end in the light emitted by the light emitters 21, so as to reduce an amount of the large-view-angle light of the first end of the display baseplate, and further reduce the large-view-angle brightness distribution difference of the light emitted by the light emitters 21 at the opposite sides in the row direction as well as the large-view-angle chromatic aberration at opposite sides of the display baseplate in the row direction, helping improve the use experiences of the users.

Further, as shown in FIG. 4, the surfaces, away from the substrate 10, of the transparent encapsulation structures 50 corresponding to the light emitter G with the luminous color as green and the light emitter B with the luminous color as blue are the inclined surfaces 51. It can be seen from FIG. 10 that, in the row direction, in the display baseplate of the comparative embodiment, the large-view-angle brightness distribution difference and chromatic aberration of the blue light and the green light at the opposite sides of the display baseplate are larger. In the embodiment shown in FIG. 4, the first end and the second end are two opposite ends of the display baseplate in the row direction. From FIG. 10, it can be seen that, by disposing the surfaces, away from the substrate 10, of the transparent encapsulation structures 50 corresponding to the light emitter G with the luminous color as green and the light emitter B with the luminous color as blue, as the inclined surfaces 51, the large-view-angle brightness difference of the blue light and the green light at the two opposite sides of the display baseplate in the row direction may be improved effectively and the large-view-angle chromatic aberration at the two opposite sides of the display baseplate in the row direction may be reduced, so as to improve the use experiences of the users.

Furthermore, as shown in FIG. 4, the surfaces, away from the substrate 10, of the transparent encapsulation structures 50 corresponding to the light emitter G with the luminous color as green and the light emitter B with the luminous color as blue are the inclined surfaces 51, and an angle of inclination of the inclined surface 51 corresponding to the light emitter G with the luminous color as green is greater than an angle of inclination of the inclined surface 51 corresponding to the light emitter B with the luminous color as blue, where the angle of inclination refers to an included angle between the inclined surface and a horizontal plane (a plane parallel to an extending direction of the substrate). From FIG. 10, it can be seen that, in the row direction, in the display baseplate of the comparative embodiment, the large-view-angle brightness distribution difference of the green light at the two opposite sides of the display baseplate is greater than the large-view-angle brightness distribution difference of the blue light at the two opposite sides of the display baseplate. In the embodiment shown in FIG. 4, the first end and the second end are two opposite ends of the display baseplate in the row direction. From FIG. 10, it can be seen that, since the angle of inclination of the inclined surface 51 corresponding to the light emitter G with the luminous color as green is greater than the angle of inclination of the inclined surface 51 corresponding to the light emitter B with the luminous color as blue, the green light receives stronger scattering effect than the blue light in the large-view-angle light proximate to the first end, helping to reduce the large-view-angle brightness distribution difference of the green light at the two opposite sides of the display baseplate, and make the large-view-angle brightness distributions of the blue light and the green light at the two opposite sides of the display baseplate in the row direction more consistent. As a result, the large-view-angle brightness distribution difference at the two opposite sides of the display baseplate in the row direction can be reduced and the large-view-angle chromatic aberration at the two opposite sides of the display baseplate in the row direction can be reduced as well.

Figure 11:
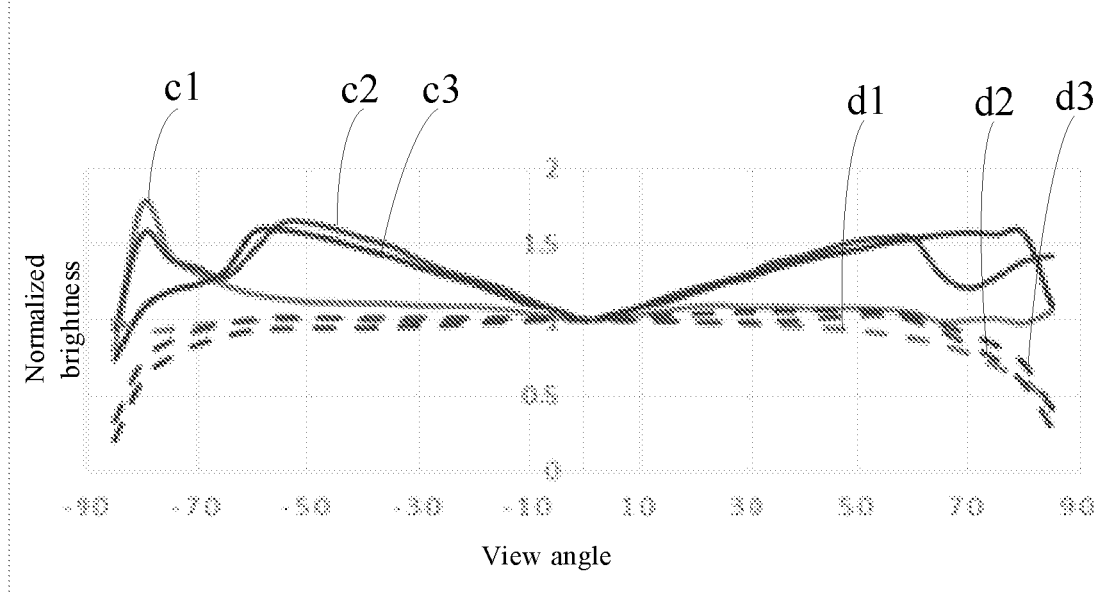
FIG. 11 is a curve diagram illustrating light brightness of another display baseplate and a control display baseplate along with view angle according to some embodiments of the present disclosure.

FIG. 11 is a curve diagram of light brightness distribution of the display baseplate in the column direction, where the curve c1, the curve c2 and the curve c3 respectively represent curves of changes of the brightness of the red light, the green light and the blue light of the display baseplate (the display baseplate is not provided with the light-adjusting structure and the diffusion structure) in a comparative embodiment along with view angle, and the curve d1, the curve d2 and the curve d3 respectively represent curves of changes of the brightness of the red light, the green light and the blue light of the display baseplate shown in FIG. 4 along with view angle, where the position with the view angle less than 0 is a position closer to the second end of the display baseplate, and the position with the view angle greater than 0 is a position closer to the first end of the display baseplate. From FIG. 11, it can be seen that, in the column direction, in the display baseplate of the comparative embodiment, the large-view-angle brightness distribution difference of the lights of different colors at two opposite sides of the display baseplate is larger and the large-view-angle chromatic aberration at two opposite sides of the display baseplate in the row direction is larger. In the display baseplate provided by the embodiment shown in FIG. 4 in the present disclosure, the large-view-angle brightness difference of the lights of different colors at two opposite sides of the display baseplate in the column direction may be effectively improved, and the large-view-angle chromatic aberration at two opposite sides of the display baseplate in the row direction is reduced, so as to improve the use experiences of the users.

In some embodiments, the scattered particles in the transparent encapsulation structure corresponding to each light emitter 21 are not uniformly distributed, and the scattered particles in the part, proximate to the first end, of the transparent encapsulation structures corresponding to at least part of the light emitters have a larger density than the scattered particles in the part thereof proximate to the second end. In this way, there will be more scattered particles in the part, proximate to the first end 101, of the transparent encapsulation structures 50 corresponding to at least part of the light emitters 21, and these scattered particles have stronger scattering effect on the light proximate to the first end in the light emitted by these light emitters 21, so as to reduce an amount of the large-view-angle light of the first end of the display baseplate. Further, the brightness distribution difference of these light emitters 21 at both sides in the row direction is reduced, helping to improve the use experiences of the users.

In some embodiments, in a case where the light emitter group 20 includes a light emitter G with the luminous color as green, a light emitter R with the luminous color as red, and a light emitter B with the luminous color as blue, the first end and the second end are two opposite ends of the display baseplate in the row direction. The scattered particles 41 in the part, proximate to the first end, of the transparent encapsulation structures 50 corresponding to the light emitter G with the luminous color as green and the light emitter B with the luminous color as blue have a larger density than the scattered particles 41 in the part thereof proximate to the second end 102. In this way, the scattered particles 41 have stronger scattering effect on the blue light and the green light in the large-view-angle light of the first end of the display baseplate, which may effectively improve the large-view-angle brightness difference of the blue light and green light at two opposite sides of the display baseplate in the row direction, so as to help improve the use experiences of the users.

Furthermore, the first end and the second end are two opposite ends of the display baseplate in the row direction. The density of the scattered particles 41 in the part, proximate to the first end 101, of the transparent encapsulation structure 50 corresponding to the light emitter G with the luminous color as green is greater than the density of the scattered particles 41 in the part, proximate to the first end 101, of the transparent encapsulation structure 50 corresponding to the light emitter B with the luminous color as blue. In this way, the green light receives stronger scattering effect than the blue light in the large-view-angle light proximate to the first end, helping to reduce the large-view-angle brightness distribution difference of the green light at the two opposite sides of the display baseplate, and make the large-view-angle brightness distributions of the blue light and the green light at the two opposite sides of the display baseplate in the row direction more consistent.

Figure 5:
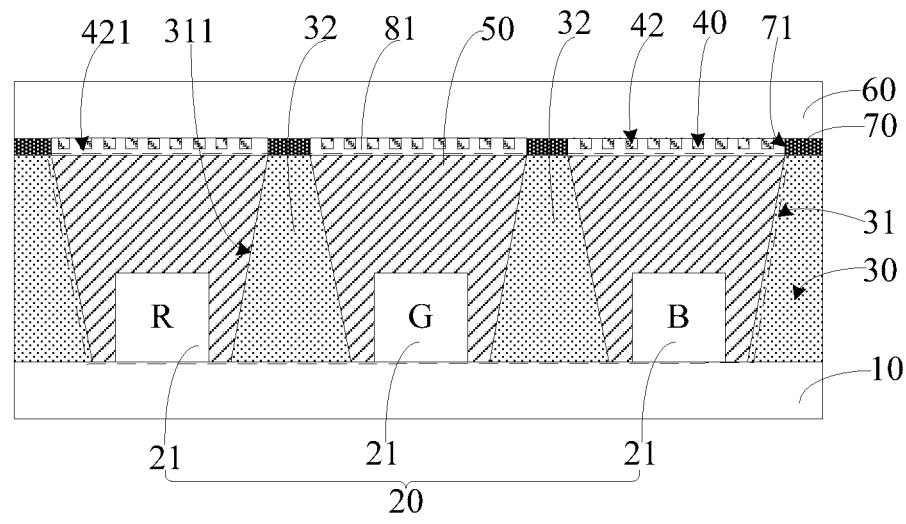
FIG. 5 is a partial sectional view of yet another display baseplate according to some exemplary embodiments of the present disclosure.

In some embodiments, as shown in FIGS. 5 and 6, the diffusion structure 40 includes a micro-structure array 42 located at a side of the light-adjusting structure 30 away from the substrate 10. The micro-structure array 42 includes a plurality of micro-structures 421 arranged in a spacing. The micro-structure array 42 can increase the scattered degree of the light emitted by the light emitters 21, and enlarge the view angle of the display baseplate. Further, the chromatic aberration of the lights of the positive view angle and the large-view-angle can be reduced, so as to improve the use experiences of the users.

In some embodiments, the micro-structure 421 may be a micro-lens structure, a pyramid structure, or a prism structure or the like. The micro-structure 421 may have a diameter of 1 μm to 10 μm. A distance between centers of adjacent micro-structures 421 is 4 μm to 20 μm. In this way, it can be guaranteed that the micro-structure array 42 has better scattering effect on the light. The diameter of the micro-structure 421 may be, for example, 1 μm, 3 μm, 5 μm, 7 μm, 9 μm, 10 μm or the like; and the distance between the centers of adjacent micro-structures 421 may be, for example, 4 μm, 8 μm, 12 μm, 16 μm, 20 μm or the like.

In some embodiments, four adjacent micro-structures 421 in the micro-structure array 42 may be arranged into regular rectangle or rhombus, or the micro-structures 421 in the micro-structure array 42 may be arranged randomly.

In some embodiments, as shown in FIG. 6, the display baseplate includes a first end 101 and a second end 102 that are opposite to each other. The micro-structures 421 in the part, proximate to the first end 101, of the micro-structure arrays 42 corresponding to at least part of the light emitters

21 have a larger density than the micro-structures 421 in the part thereof proximate to the second end 102. In this way, the micro-structure arrays 42 corresponding to at least part of the light emitters 21 have stronger scattering effect on the light proximate to the first end in the light emitted by these light emitters 21, so as to reduce an amount of the large-view-angle light of the first end of the display baseplate and further reduce the large-view-angle brightness distribution difference of two opposite sides of the display baseplate, helping to improve the use experiences of users.

In some embodiments, the micro-structures 421 in the part of the micro-structure array 42 proximate to the first end 101 have a smaller size than the micro-structures 421 in the part thereof proximate to the second end 102.

Figure 12:
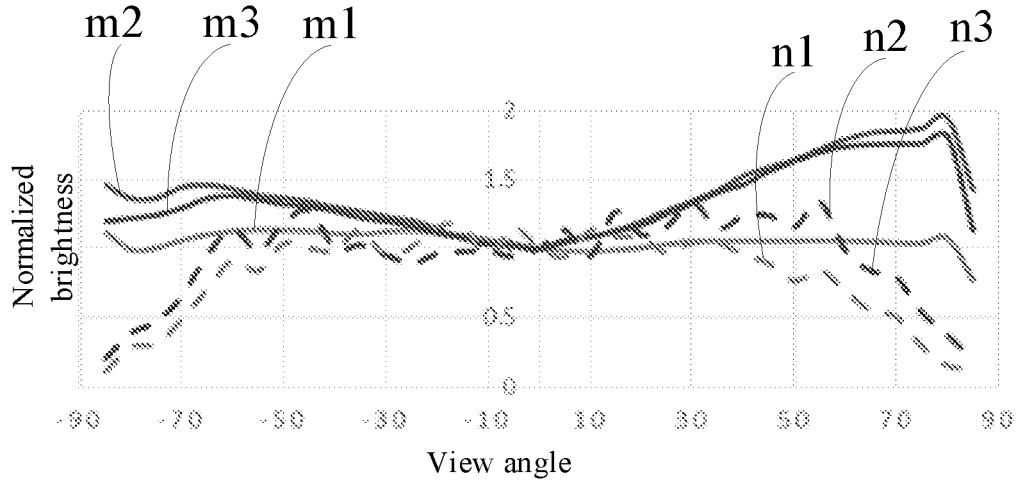
FIG. 12 is a curve diagram illustrating light brightness of yet another display baseplate and a control display baseplate along with view angle according to some embodiments of the present disclosure.

FIG. 12 is a curve diagram of light brightness distribution in the row direction of the display baseplate, where the curve m1, the curve m2 and the curve m3 respectively represent curves of changes of the brightness of the red light, the green light and the blue light of the display baseplate (the display baseplate is not provided with the light-adjusting structure and the diffusion structure) in a comparative embodiment along with view angle, and the curve n1, the curve n2 and the curve n3 (the curve n2 and the curve n3 are in coincidence) respectively represent curves of change of the brightness of the red light, the green light and the blue light of the display baseplate shown in FIG. 6 along with view angle, where the position with the view angle less than 0 is a position closer to the second end of the display baseplate, and the position with the view angle greater than 0 is a position closer to the first end of the display baseplate. From FIG. 12, it can be seen that, in the row direction, the brightness distribution difference and chromatic aberration of the light at both sides of the display baseplate in the comparative embodiment are larger. In the display baseplate provided by the embodiment shown in FIG. 6 of the present disclosure, the first end and the second end are two opposite ends of the display baseplate in the row direction. From FIG. 12, it can be seen that, since the micro-structures 421 in the part, proximate to the first end 101, of the micro-structure arrays 42 corresponding to at least part of the light emitters 21 have a larger density than the micro-structures 421 in the part thereof proximate to the second end 102, the micro-structure arrays 42 have stronger scattering effect on the light proximate to the first end in the light emitted by these light emitters 21, so as to reduce an amount of the large-view-angle light of the first end of the display baseplate and further reduce the large-view-angle brightness distribution difference of the light emitted by these light emitters 21 at two opposite sides in the row direction as well as the large-view-angle chromatic aberration of the two opposite sides of the display baseplate in the row direction, helping to improve the use experiences of users.

Furthermore, in a case where the light emitter group 20 includes a light emitter G with the luminous color as green, a light emitter R with the luminous color as red, and a light emitter B with the luminous color as blue, the micro-structures 421 in the part, proximate to the first end 101, of the micro-structure arrays 42 corresponding to the light emitter G with the luminous color as green and the light emitter B with the luminous color as blue have a larger density than the micro-structures 421 in the part thereof proximate to the second end 102. From FIG. 12, it can be seen that, in the row direction, in the display baseplate of the comparative embodiment, the large-view-angle brightness distribution difference and chromatic aberration of the blue light and the green light at the two opposite sides of the display baseplate are larger. In the display baseplate provided by the embodiment shown in FIG. 6 of the present disclosure, the first end and the second end are two opposite ends of the display baseplate in the row direction. From FIG. 12, it can be seen that, the micro-structure arrays 42 have stronger scattering effect on the blue light and the green light in the large-view-angle light of the first end of the display baseplate, which can effectively improve the large-view-angle brightness difference of the blue light and green light at two opposite sides of the display baseplate in the row direction and reduce the large-view-angle chromatic aberration of the two opposite sides of the display baseplate in the row direction, so as to help improve the use experiences of the users.

Furthermore, as shown in FIG. 6, the density of the micro-structures 421 in the part, proximate to the first end 101, of the micro-structure array 42 corresponding to the light emitter G with the luminous color as green is greater than the density of the micro-structures 421 in the part, proximate to the first end 101, of the micro-structure array 42 corresponding to the light emitter B with the luminous color as blue. It can be seen from FIG. 12, in the row direction, in the display baseplate of the comparative embodiment, the large-view-angle brightness distribution difference of the green light at two opposite sides of the display baseplate is greater than the large-view-angle brightness distribution difference of the blue light at two opposite sides of the display baseplate. In the embodiment shown in FIG. 6, the first end and the second end are two opposite ends of the display baseplate in the row direction. From FIG. 12, it can be seen that, in the display baseplate provided by the embodiment shown in FIG. 6, the green light receives stronger scattering effect than the blue light in the large-view-angle light proximate to the first end, helping to reduce the large-view-angle brightness distribution difference of the green light at the two opposite sides of the display baseplate, and make the large-view-angle brightness distributions of the blue light and the green light at the two opposite sides of the display baseplate more consistent. Thus, the large-view-angle brightness distribution difference of two opposite sides of the display baseplate in the row direction can be reduced and the large-view-angle chromatic aberration of two opposite sides of the display baseplate in the row direction can be reduced as well.

Figure 13:
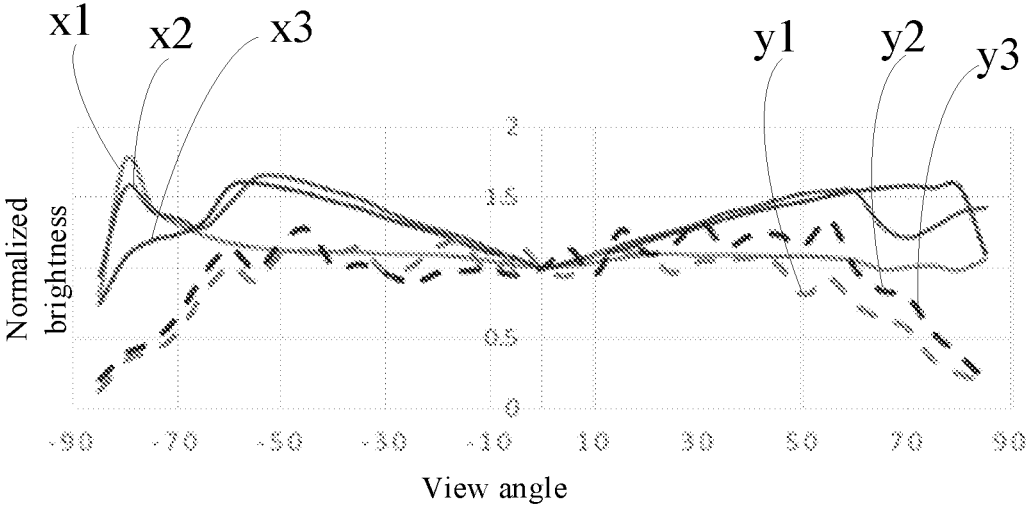
FIG. 13 is a curve diagram illustrating light brightness of yet another display baseplate and a control display baseplate along with view angle according to some embodiments of the present disclosure.

FIG. 13 is a curve diagram of light brightness distribution in the column direction of the display baseplate, where the curve x1, the curve x2 and the curve x3 respectively represent curves of changes of the brightness of the red light, the green light and the blue light of the display baseplate (the display baseplate is not provided with the light-adjusting structure and the diffusion structure) in a comparative embodiment along with view angle, and the curve y1, the curve y2 and the curve y3 (the curve y2 and the curve y3 are in coincidence) respectively represent curves of change of the brightness of the red light, the green light and the blue light of the display baseplate shown in FIG. 6 along with view angle, where the position with the view angle less than 0 is a position closer to the second end of the display baseplate, and the position with the view angle greater than 0 is a position closer to the first end of the display baseplate. From FIG. 13, it can be seen that, in the column direction, the brightness distribution difference of the light at two sides of the display baseplate of the comparative embodiment is larger. In the display baseplate provided by the embodiments of the present disclosure, the large-view-angle brightness difference of the lights of different colors at the two opposite sides of the display baseplate in the column direction can be effectively improved, and the large-view-angle chromatic aberration of the two opposite sides of the display baseplate in the row direction can be reduced, so as to improve the use experiences of the users.

In some embodiments, a refractive index of the transparent encapsulation structures 50 is less than a refractive index of the micro-structures 421. In this way, it can be ensured that more of the light emitted by the light emitters 21 can be emitted through the micro-structures 421. In some embodiments, a difference between the refractive index of the micro-structures 421 and the refractive index of the transparent encapsulation structures 50 is in a range of 0.2 to 2, inclusive.

In some embodiments, as shown in FIGS. 1 to 6 and 14, the display baseplate further includes a light adjusting layer 70 located at a side of the light-adjusting structure 30 away from the substrate 10, where a plurality of through holes 71 are disposed in the light-adjusting layer 70. The orthographic projection of each light emitter on the substrate 10 is located within an orthographic projection of one through hole 71 on the substrate 10. The light-adjusting layer 70 may be a black film layer, for example, the light-adjusting layer 70 may be obtained by coating a resin material with a low transmittance. The light-adjusting layer 70 can effectively reduce the reflective index of environmental light incident on the display baseplate, so as to improve the use experiences of the users. Further, the light emitted by the light emitters 21 can emitted through the through holes 71 of the light-adjusting layer 70. Compared with the solution in which the light emitters 21 are covered by a light-blocking layer, the problem that the working current of the display baseplate becomes larger due to a low transmittance of the light-blocking layer, further increasing the power consumption and the working temperature of the display baseplate, can be avoided. The light-adjusting layer 70 can block the traces of the display baseplate on the substrate, helping improve the display effect of the display baseplate. When the light-adjusting layer 70 is obtained by coating the resin material with low transmittance, since the manufacture process of the light-adjusting layer 70 is mature, the thickness deviation of each region is small. Thus, the blackness difference of the regions of the display baseplate in a non-display state is small. In a display screen obtained by splicing a plurality of display baseplates, since the difference of the thicknesses of the light-adjusting layers 70 of different display baseplates is small, the blackness difference of the different display baseplates in the display screen in a non-display state is small.

In some embodiments, as shown in FIGS. 1, and 3 to 6, the orthographic projection of each light emitter 21 on the substrate 10 is located within the orthographic projection of one through hole 71 on the substrate 10. The light emitters 21 may be in one-to-one correspondence with the through holes 71. The orthographic projection of each light emitter 21 on the substrate 10 is located within the orthographic projection of the corresponding through hole 71 on the substrate 10. In this way, the light-adjusting layer 70 can cover the region between adjacent light emitters 21, helping to avoid mutual interference of the lights emitted by adjacent light emitters 21. Hence, the display contrast of the display baseplate is increased, so as to improve the display effect.

Figure 14:
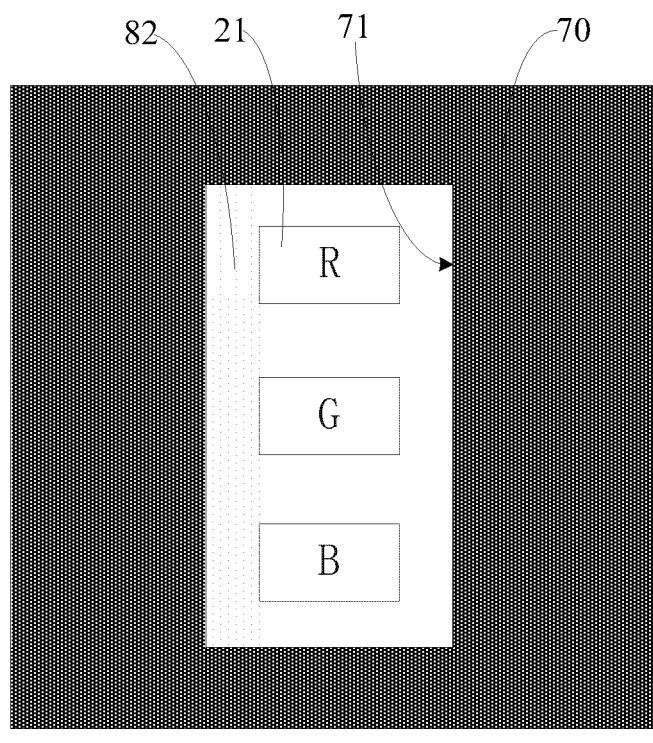
FIG. 14 is a partial structural view of a display baseplate according to some exemplary embodiments of the present disclosure.

In some embodiments, as shown in FIGS. 2 and 14, the orthographic projection of each light emitter 21 in each light emitter group 20 on the substrate 10 is located within the orthographic projection of one through hole 71 on the substrate 10. The light emitter groups 20 may be in one-to-one correspondence with the through holes 71. The orthographic projections of the light emitters 21 in each light emitter group 20 on the substrate 10 are all located within the orthographic projection of the corresponding through hole 71 on the substrate 10. In this embodiment, the through holes 71 of the light-adjusting layer 70 have a large size and the light emitted by the light emitters 21 has a high transmittance, and low requirements are provided for the manufacture accuracy of the light-adjusting layer 70.

In some embodiments, as shown in FIGS. 1 to 6, the display baseplate further includes an encapsulation cover plate 60 located at a side of the diffusion structure 40 away from the substrate 10. The encapsulation cover plate 60 can protect the structure, for example, the light emitters 21 between the encapsulation cover plate 60 and the substrate 10 against any damage. A material of the encapsulation cover plate 60 may be glass. The light-adjusting layer 70 is disposed at a side of the encapsulation cover plate 60 facing toward the substrate 10.

In some embodiments, as shown in FIGS. 3 and 14, the display baseplate further includes a light transmission layer 82 located at a side of the light-adjusting structure 30 away from the substrate 10. The orthographic projection of the light emitters 21 on the substrate 10 is located within an orthographic projection of the light transmission layer 82 on the substrate 10. A light transmittance of the light transmission layer 82 is greater than a light transmittance of the light-adjusting layer 70, and less than a light transmittance of the transparent encapsulation structure 50. Since the light transmittance of the light transmission layer 82 is less than the light transmittance of the transparent encapsulation structure 50, the reflective index of the environmental light incident on the light transmission layer 82 is low, helping to reduce the reflective index of the environmental light. Since the difference between the light transmittances of the light transmission layer 82 and the light-adjusting layer 70 is small, the blackness difference of different regions of the display baseplate in a non-display state is small. The material of the light transmission layer 82 may be shown as gray and the material may be a photoresist material, for example, a positive photoresist material or a negative photoresist material.

In some embodiments, the light transmission layer 82 is at least partially filled in the through holes 71 of the light-adjusting layer 70. Thus, the disposal of the light transmission layer 82 will not be increase the thickness of the display baseplate.

Figure 15:
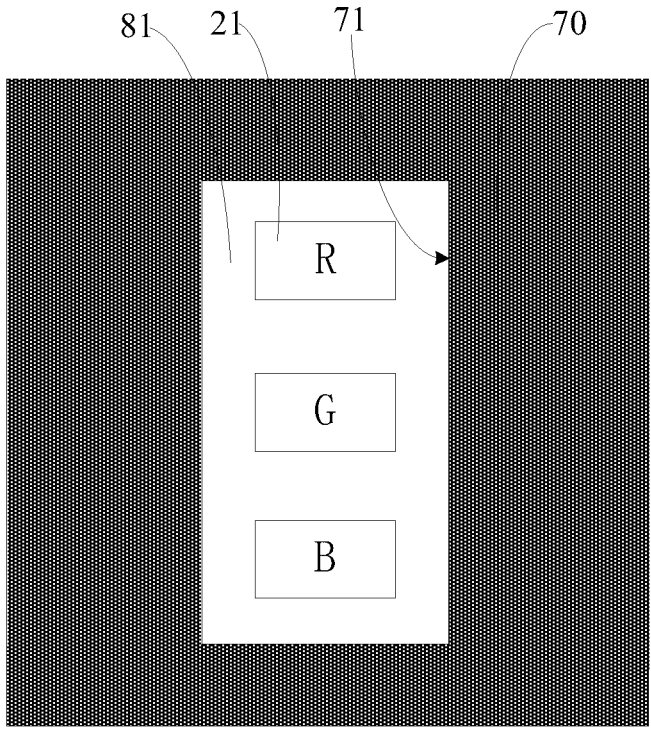
FIG. 15 is a partial structural view of another display baseplate according to some exemplary embodiments of the present disclosure.

In some embodiments, as shown in FIGS. 1, 2 and 15, the display baseplate may not be provided with the light transmission layer 82. The display baseplate may include a transparent glue 81 filled in the through holes 71 of the light-adjusting layer 70, and the transparent glue 81 bonds the encapsulation cover plate 60 and the light-adjusting structure 30 together. The materials of the transparent glue 81 and the transparent encapsulation structures 50 may be same.

By comparison of FIGS. 14 and 15, it can be seen that, when the display baseplate includes the light transmission layer 82 filled in the through holes 71, a blackness of a region of the display baseplate in a non-display state, where the light transmission layer 82 is disposed, differs little from the blackness of the region where the light-adjusting layer 70 is disposed, helping to improve the use experiences of the users.

Some embodiments of the present disclosure provide a method for manufacturing a display baseplate. The method for manufacturing a display baseplate will be described below.

In some embodiments, the display baseplate is the display baseplate shown in FIGS. 1 and 2. The method for manufacturing the display baseplate is performed in the following process.

Firstly, an encapsulation baseplate and a light-emitting baseplate are manufactured respectively.

In some embodiments, the encapsulation baseplate may be manufactured in the following process:

providing an encapsulation cover plate and forming a light-adjusting layer at a side of the encapsulation cover plate.

In some embodiments, the light-emitting baseplate is manufactured in the following process:

providing a substrate, and disposing a light emitter on the substrate;

next, forming a light-adjusting structure on the substrate;

next, filling a transparent encapsulation structure doped with scattered particles in the chamber of the light-adjusting structure;

next, filling up a gap between the light-adjusting structure and the light emitter by using a transparent glue, so as to obtain the light-emitting baseplate.

After the encapsulation baseplate and the light-emitting baseplate are manufactured, a side of the encapsulation baseplate where the light-adjusting layer is disposed is attached to the light-emitting baseplate, and the light-emitting baseplate and the encapsulation baseplate are bonded together by using the transparent glue, so as to obtain the display baseplate shown in FIGS. 1 and 2.

In some embodiments, the display baseplate is the display baseplate as shown in FIGS. 5 and 6. The display baseplate is manufactured in the following process.

Firstly, an encapsulation baseplate and a light-emitting baseplate are manufactured respectively.

In some embodiments, the encapsulation baseplate is manufactured in the following process:

providing an encapsulation cover plate and a forming a light-adjusting layer at a side of the encapsulation cover plate;

next, forming a micro-array structure in a through hole of the light-adjusting layer to obtain the encapsulation baseplate.

In some embodiments, the light-emitting baseplate is manufactured in the following process:

providing a substrate and forming a light emitter on the substrate;

next, forming a light-adjusting structure on the substrate;

next, filling up a gap between the light-adjusting structure and the light emitter by using a transparent glue to obtain the light-emitting baseplate, where a part of the transparent glue inside the chamber of the light-adjusting structure is a transparent encapsulation structure.

After the encapsulation baseplate and the light-emitting baseplate are manufactured, a side of the encapsulation baseplate where the light-adjusting layer is disposed is attached to the light-emitting baseplate, and the light-emitting baseplate and the encapsulation baseplate are bonded together by using the transparent glue, so as to obtain the display baseplate shown in FIGS. 5 and 6.

Figure 16:
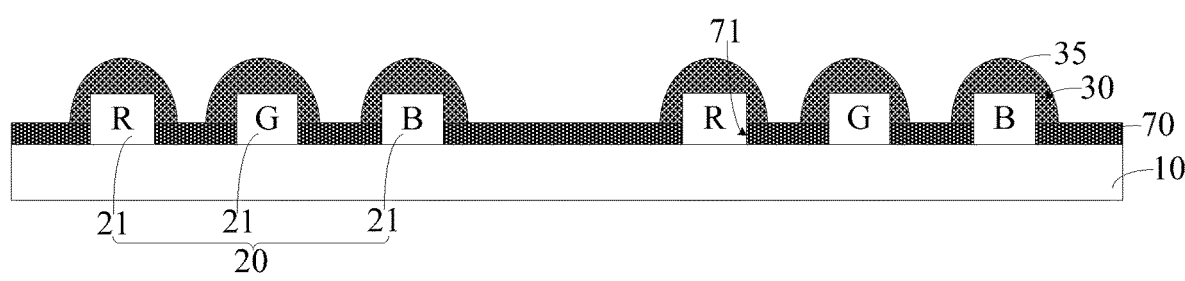
FIG. 16 is a partial sectional view of yet another display baseplate according to some exemplary embodiments of the present disclosure.

Some embodiments of the present disclosure provide a display baseplate. As shown in FIG. 16, the light-adjusting structure 30 includes convex lens structures 35 wrapping the light emitters 21. The light emitters 21 are in one-to-one correspondence with the convex lens structures 35, and each convex lens structure 35 wraps the corresponding light emitter 21. The convex lens structures 35 can converge light emitted by the light emitters 21 to increase an amount of light of positive view angle of the display baseplate and reduce an amount of light of side view angle, such that the amount of light of the display baseplate gradually decreases from the positive view angle to the side view angle, better satisfying the watching habit of the human eyes and helping improve the use experiences of the users.

In some embodiments, the diffusion structure includes scattered particles dispersed in the convex lens structures 35. The scattered particles dispersed in the convex lens structures 35 can ensure the amount of large-view-angle light and the light brightness changes smoothly from the positive view angle to the side view angle, better satisfying watching habit of the human eyes. Further, the chromatic aberration of the lights of the positive view angle and the large-view-angle can be reduced and the display effect of the display baseplate can be improved.

In some embodiments, as shown in FIG. 16, the display baseplate further includes a light-adjusting layer 70 located on the substrate 10. A plurality of through holes 71 are disposed in the light-adjusting layer 70. An orthographic projection of each light emitter 21 on the substrate is located within an orthographic projection of one through hole 71 on the substrate. The light-adjusting layer 70 is in contact with a side portion of each light emitter 21. That is, an edge of the orthographic projection of the through hole 71 of the light-adjusting layer 70 on the substrate 10 coincides with an edge of the orthographic projection of the corresponding light emitter 21 on the substrate 10. In this way, the area of the light-adjusting layer 70 is increased, such that the blackness of the display baseplate in a non-display state is higher, helping to improve the use experiences of the users.

Some embodiments of the present disclosure provide a display apparatus, including the display baseplate mentioned in any one of the above embodiments.

In some embodiments, a display screen of the display apparatus provided by the embodiments of the present disclosure may be a spliced screen, which is formed by splicing a plurality of display baseplates. The manufacture process of the light-adjusting layer 70 is mature, and the thickness difference of the light-adjusting layers 70 of different display baseplates is small, and thus the blackness difference of the display baseplates in the spliced screen in a non-display state is small, thereby improving the use experiences of the users.

In some embodiments, the display apparatus further includes a casing in which the display baseplates are embedded.

The display apparatus provided by the embodiments of the present disclosure may be any proper display apparatus, including but not limited to: smart phone, tablet computer, television, display, laptop computer, digital photo frame, navigator, electronic book and any other products or components having display function.

It will be noted that in the accompanying drawings, for illustration clarity, the sizes of the layers and regions may be exaggerated. Furthermore, it may be understood that when an element or layer is referred to as being "on" another element or layer, such element or layer may be directly on the another element or layer or there is an intermediate layer therebetween. Further, it is understood that when an element or layer is referred to as being "under" another element or layer, such element or layer may be directly under the another element or layer, or one or more intermediate elements or layers are present therebetween. In addition, it may also be understood that when a layer or element is referred to as being between two layers or elements, such layer or element may be a sole layer between the two layers or elements, or one or more intermediate layers or elements are present. Like reference signs in the descriptions indicate like elements.

Other implementations of the present disclosure will be apparent to a person skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A display baseplate, comprising:
a substrate;
light emitter groups on the substrate, wherein the light emitter groups each comprise a plurality of light emitters;
a light-adjusting structure on the substrate, wherein a plurality of chambers are disposed in the light-adjusting structure, each light emitter group is located in one or more of the plurality of chambers; orthographic projections of the chambers in which the light emitter groups are located on the substrate have basically same area; a distance between adjacent light emitters in a same light emitter group is less than a distance between adjacent light emitter groups, and at least one chamber without one of the light emitter groups is present between adjacent light emitter groups; the light-adjusting structure is configured to converge light emitted by the light emitters to increase an amount of light of positive view angle of the display baseplate; and
a diffusion structure on the substrate, wherein the diffusion structure is at least partially located at a side of the light emitters away from the substrate, and configured to diffuse the light emitted by the light emitters.

2. The display baseplate according to claim 1, wherein there is a gap between a side surface of the light emitters and an inner surface of the chambers.

3. The display baseplate according to claim 1, wherein a gray value of the light-adjusting structure is greater than 0 and less than 1.

4. The display baseplate according to claim 1, wherein the light-adjusting structure comprises reflection blocking walls inside the chambers, the reflection blocking walls partition the chambers into a plurality of sub-chambers, and one light emitter is located in one sub-chamber; orthographic projections of the sub-chambers on the substrate have basically same area.

5. The display baseplate according to claim 1, further comprising transparent encapsulation structures at least partially filled in the chambers.

6. The display baseplate according to claim 5, wherein the diffusion structure comprises scattered particles scattered in the transparent encapsulation structures.

7. The display baseplate according to claim 6, further comprising a first end and a second end that are opposite to each other; wherein, one light emitter is wrapped by one transparent encapsulation structure, the scattered particles are uniformly distributed in the transparent encapsulation structure, each of surfaces, away from the substrate, of the transparent encapsulation structures corresponding to at least part of the light emitters is an inclined surface, and in a direction pointing to the second end from the first end, the inclined surface is inclined toward the substrate; or, scattered particles in a part, proximate to the first end, of the transparent encapsulation structures corresponding to at least part of the light emitters have a larger density than scattered particles in a part thereof proximate to the second end.

8. The display baseplate according to claim 7, wherein the light emitter groups each comprise a light emitter with a luminous color as green, a light emitter with a luminous color as red and a light emitter with a luminous color as blue;

each of the surfaces, away from the substrate, of the transparent encapsulation structures corresponding to the light emitter with the luminous color as green and the light emitter with the luminous color as blue is the inclined surface;

or, the scattered particles in the part, proximate to the first end, of the transparent encapsulation structures corresponding to the light emitter with the luminous color as green and the light emitter with the luminous color as blue have a larger density than the scattered particles in the part thereof proximate to the second end.

9. The display baseplate according to claim 8, wherein in a case where each of the surfaces, away from the substrate, of the transparent encapsulation structures corresponding to the light emitter with the luminous color as green and the light emitter with the luminous color as blue is the inclined surface, an angle of inclination of an inclined surface corresponding to the light emitter with the luminous color as green is greater than an angle of inclination of an inclined surface corresponding to the light emitter with the luminous color as blue;

or, in a case where the scattered particles in the part, proximate to the first end, of the transparent encapsulation structures corresponding to the light emitter with the luminous color as green and the light emitter with the luminous color as blue have a larger density than the scattered particles in the part thereof proximate to the second end, the density of the scattered particles in the part, proximate to the first end, of the transparent encapsulation structure corresponding to the light emitter with the luminous color as green is greater than the density of the scattered particles in the part, proximate to the first end, of the transparent encapsulation structure corresponding to the light emitter with the luminous color as blue.

10. The display baseplate according to claim 1, wherein the diffusion structure comprises micro-structure arrays located at a side of the light-adjusting structure away from the substrate, and the micro-structure arrays comprise a plurality of micro-structures arranged in a spacing.

11. The display baseplate according to claim 10, further comprising a first end and a second end that are opposite to each other, wherein in a direction pointing to the second end from the first end, the micro-structures in a part, proximate to the first end, of the micro-structure arrays corresponding to at least part of the light emitters have a larger density than the micro-structures in a part thereof proximate to the second end.

12. The display baseplate according to claim 11, wherein the light emitter groups each comprise a light emitter with a luminous color as green, a light emitter with a luminous color as red and a light emitter with a luminous color as blue; the micro-structures in the part, proximate to first end, of the micro-structure arrays corresponding to the light emitter with the luminous color as green and the light emitter with the luminous color as blue have a greater density than the micro-structures in the part thereof proximate to the second end.

13. The display baseplate according to claim 12, wherein the density of the micro-structures in the part, proximate to the first end, of the micro-structure array corresponding to the light emitter with the luminous color as green is greater than the density of the micro-structures in the part, proximate to the first end, of the micro-structure array corresponding to the light emitter with the luminous color as blue.

14. The display baseplate according to claim 1, further comprising a light-adjusting layer located at a side of the light-adjusting structure away from the substrate, and a plurality of through holes are disposed in the light-adjusting layer;

an orthographic projection of each light emitter on the substrate is located within an orthographic projection of one through hole on the substrate; or, orthographic projections of the light emitters in each light emitter group on the substrate are all located within the orthographic projection of one through hole on the substrate.

15. The display baseplate according to claim 14, further comprising a light transmission layer located at a side of the light-adjusting structure away from the substrate, and the orthographic projections of the light emitters on the substrate are located within an orthographic projection of the light transmission layer on the substrate; the display baseplate further comprises transparent encapsulation structures at least partially filled in the chambers;

a light transmittance of the light transmission layer is greater than a light transmittance of the light-adjusting layer and less than a light transmittance of the transparent encapsulation structures.

16. A display apparatus, comprising the display baseplate of claim 1.

* * * * *